US 6,541,343 B1

(12) United States Patent
Murthy et al.

(10) Patent No.: US 6,541,343 B1
(45) Date of Patent: Apr. 1, 2003

(54) METHODS OF MAKING FIELD EFFECT TRANSISTOR STRUCTURE WITH PARTIALLY ISOLATED SOURCE/DRAIN JUNCTIONS

(75) Inventors: Anand S. Murthy, Beaverton, OR (US); Robert S. Chau, Beaverton, OR (US); Patrick Morrow, Portland, OR (US); Robert S. McFadden, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,836

(22) Filed: Dec. 30, 1999

(51) Int. Cl.[7] ............................................. H01L 21/336
(52) U.S. Cl. ...................................... 438/299; 438/300
(58) Field of Search ................................. 438/142, 167, 438/173, 180, 186, 192, 196, 197, 268, 269, 270, 271, 272, 273, 274, 294, 295, 296, 297, 298, 299, 300, 301, 302, 303, 306

(56) References Cited

U.S. PATENT DOCUMENTS

| 4,475,982 | A | | 10/1984 | Lai et al. |
|---|---|---|---|---|
| 5,110,408 | A | | 5/1992 | Fujii et al. |
| 5,908,313 | A | | 6/1999 | Chau et al. |
| 6,071,783 | A | * | 6/2000 | Liang et al. |

OTHER PUBLICATIONS

PCT Search Report for Int'l application # PCT/US00/42279, mailed Oct. 12, 2001, 5 pgs.

* cited by examiner

Primary Examiner—Michael J. Sherry
Assistant Examiner—Evan Pert
(74) Attorney, Agent, or Firm—Blakely, Sokoloff, Taylor & Zafman LLP (57) ABSTRACT

A microelectronic structure includes at least one source/drain terminal of a first conductivity type that is partially isolated from a region of semiconductor material of a second conductivity type. In a further aspect of the invention, a process for forming a microelectronic structure, such as a MOSFET, having at least one source/drain terminal of a first conductivity type that is partially isolated from a region of semiconductor material of a second conductivity type includes forming a recess having a surface, forming a dielectric material over a portion of the surface of the recess, and back-filling the recess to form a source/drain terminal.

21 Claims, 4 Drawing Sheets

METHODS OF MAKING FIELD EFFECT TRANSISTOR STRUCTURE WITH PARTIALLY ISOLATED SOURCE/DRAIN JUNCTIONS

BACKGROUND OF THE INVENTION

1. Field of the Invention

The invention relates to metal-oxide-semiconductor field effect transistors (MOSFETS) and more particularly to transistor structures having partially isolated source/drain junctions, and methods of making same.

2. Background

The trend of integrating more functions on a single substrate while operating at ever higher frequencies has existed in the semiconductor industry for many years. These higher operating frequencies are generally made possible by advances in both semiconductor manufacturing and digital systems design and architecture.

Improvements in semiconductor manufacturing technology that lead to improved operating frequencies are generally related to improvements in the electrical characteristics of circuit elements, such as transistors and capacitors, and the structures used to interconnect the various circuit elements.

More particularly, one way to realize gains in the operating frequency characteristics of integrated circuits includes reducing parasitic capacitance. Parasitic capacitance tends to slow down the operation of integrated circuits because more current is required to charge and discharge the parasitic capacitors and therefore more time is required to drive various circuit nodes to the desired voltage. A significant amount of parasitic capacitance in integrated circuits exists in the junction capacitance associated with field effect transistors typically found on an integrated circuit.

What is needed is a field effect transistor structure having source/drain terminals with reduced junction capacitance. What is further needed is a method of manufacturing such a structure.

SUMMARY OF THE INVENTION

Briefly, a microelectronic structure includes at least one source/drain terminal of a first conductivity type that is partially isolated from a region of semiconductor material of a second conductivity type.

In a further aspect of the invention, a process for forming a microelectronic structure having at least one source/drain terminal of a first conductivity type that is partially isolated from a region of semiconductor material of a second conductivity type includes forming a recess having a surface, forming a dielectric material over a portion of the surface of the recess, and back-filling the recess to form a source/drain terminal.

DETAILED DESCRIPTION

Overview

Conventional source/drain junction formation is accomplished by one or more ion implantation operations that are generally self-aligned to the gate electrode, or alternatively, aligned to sidewall spacers that are adjacent to the gate electrode. In such a process, ions of a first conductivity type (p- or n-) are implanted into a semiconductor material of a second conductivity type (n- or p-). A capacitance between the two nodes represented by the different conductivity types arises at their junction and is a function of the width of the depletion region formed at the junction. The width of the depletion region may be affected by various conditions including but not limited to, the materials used, the concentrations of those materials, an externally supplied voltage, if any, applied across the junction, and so on. In typical circuit applications these capacitances are undesirable and are often referred to as parasitic capacitances.

In order to reduce the parasitic junction capacitance, various structures have been used wherein the source/drain material is formed on an insulating layer, such as silicon dioxide. A disadvantage of such structures is that they generally tend to create a floating body terminal in a MOSFET because the channel region is completely isolated from the well (or bulk semiconductor).

Embodiments of the present invention provide partial isolation of the source/drain terminal from the well (or bulk semiconductor) while leaving the channel region, i.e., the body terminal, electrically coupled to the well (or bulk semiconductor) rather than floating.

More particularly, source/drain terminals in accordance with the present invention include a dielectric layer, such as, for example, silicon nitride, disposed between a portion of the source/drain terminal and the well (or bulk semiconductor). In one illustrative embodiment of a process in accordance with the present invention, at least one recess having a surface is formed in a substrate, self-aligned to a gate electrode, nitrogen is implanted, self-aligned to the gate electrode, into a portion of the surface of the recess, an epitaxial silicon layer is then formed to back-fill the recess and a high temperature anneal is performed. In an alternative illustrative embodiment of a process in accordance with the present invention, at least one recess having a bottom surface and a side surface is formed self-aligned to a gate electrode; a silicon nitride layer is formed over the top and sides of the gate electrode and over the bottom and side surfaces of the recess with the nitride layer being thicker and denser on the bottom surface than on the side surface; the nitride is removed from at least the side surface of the recess thereby exposing a portion of the substrate, and a semiconductor layer is formed extending laterally outward from the exposed side surface to back-fill the recess. It should be understood, that although the illustrative embodiments above are described in connection with various operations being self-aligned to the gate electrode, this should also be taken to include being self-aligned to sidewall spacers which are commonly used adjacent to the gate electrode of a MOSFET.

Terminology

The terms, chip, integrated circuit, monolithic device, semiconductor device or component, microelectronic device or component, and similar terms and expressions are often used interchangeably in this field. The present invention is applicable to all the above as they are generally understood in the field.

Epitaxial layer refers to a layer of single crystal semiconductor material.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

Polycrystalline silicon is a nonporous form of silicon often formed by chemical vapor deposition from a silicon source gas, or other methods, and has a structure that contains crystallites or domains with large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal. Source/drain terminals are typically formed in a semiconductor substrate and have a conductivity type (i.e., p-type or n-type) that is the opposite of the conductivity type of the substrate. Sometimes, source/drain terminals are referred to as junctions. Generally, the source and drain terminals are fabricated such that they are geometrically symmetrical. Source/drain terminals may include extensions, sometimes referred to as tips, which are shallower than other portions of the source/drain terminals. The tips typically extend toward the channel region of a FET, from the main portion of the source/drain terminal. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Figure 1:
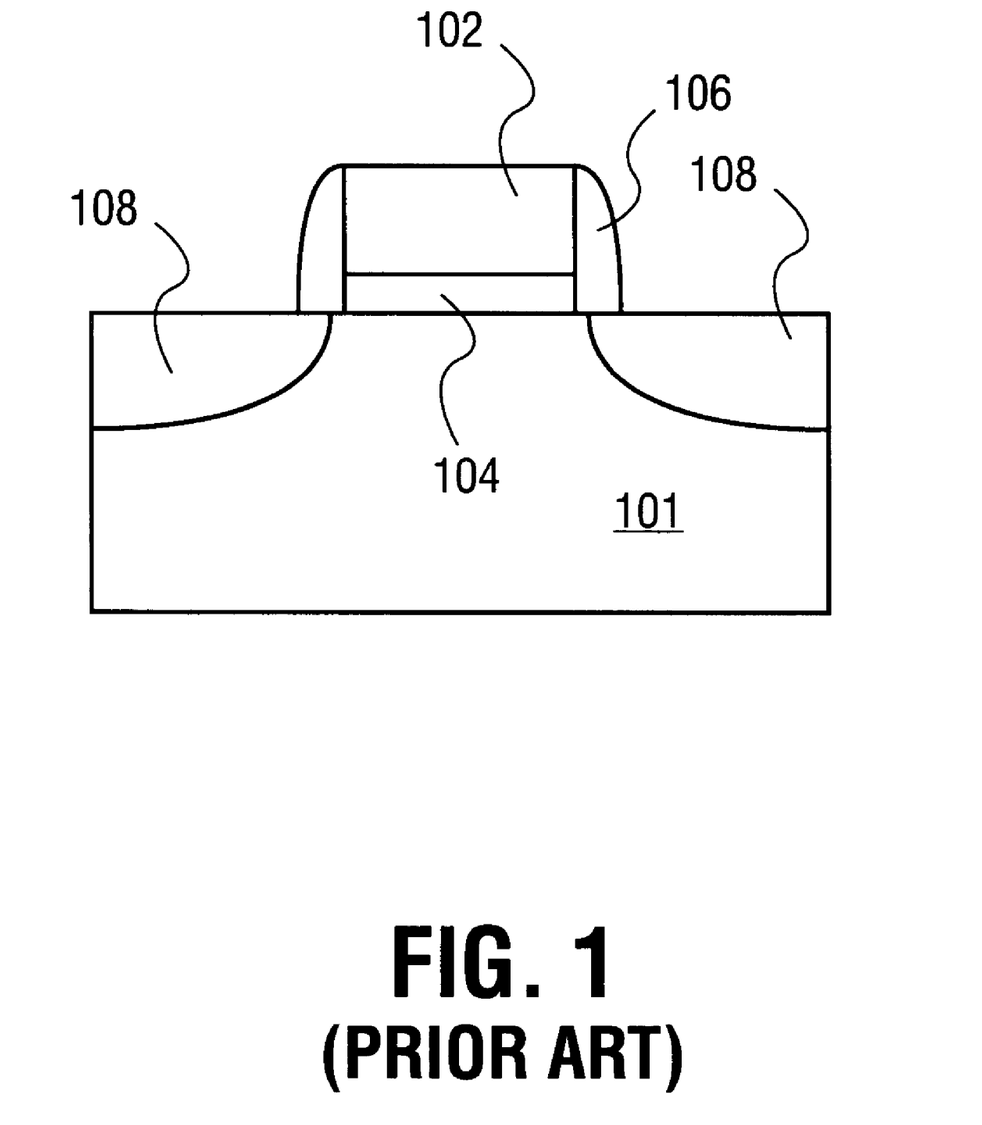
FIG. 1 is a schematic cross-section of a conventional MOSFET.

A cross-sectional view of a conventional FET is shown in FIG. 1. A gate electrode 102 is disposed superjacent a gate dielectric layer 104, which in turn is disposed superjacent a semiconductor substrate 101. Sidewall spacers 106 are disposed adjacent to the stack formed by gate dielectric 104 and gate electrode 102. Source/drain terminals 108 are disposed, adjacent to sidewall spacers 106, in substrate 101. Although a variety of materials may be used, it is typical to have substrate 101 be silicon, gate dielectric 104 be an oxide of silicon, gate electrode 102 be polysilicon, and sidewall spacers be an insulator such as silicon nitride or silicon dioxide.

Still referring to FIG. 1, it will be appreciated that source/drain terminals 108 are normally reversed biased with respect to substrate 101. The reversed biased junctions act as voltage variable capacitors since the width of the depletion region associated with a reversed biased junction is a function of the voltage across the junction. In addition to the capacitance associated with these junctions, there is also a leakage current that is associated with the junctions. Reducing both the parasitic junction capacitance and reducing the reverse-biased junction leakage current leads to higher performance circuits.

Additionally, source/drain terminals 108 of the conventional FET of FIG. 1, are susceptible to alpha particle induced soft errors. In operation, charge is often stored at the capacitor which is formed by the reversed-biased source/drain junction. Alpha particles from the environment frequently strike the substrate, passing through the substrate and generating carriers. The carriers may then migrate towards the charged source/drain junctions and affect the voltage at those nodes by changing the amount of stored charge. This phenomenon is sometimes referred to "zapping". As source/drain terminals 108 are reduced in size by manufacturers to increase integration density, the smaller source/drain terminals are able to store correspondingly less charge and are therefore correspondingly more susceptible to the effects of zapping. Protecting these nodes from zapping by isolating them from alpha particle induced carriers is desirable.

Figure 2:
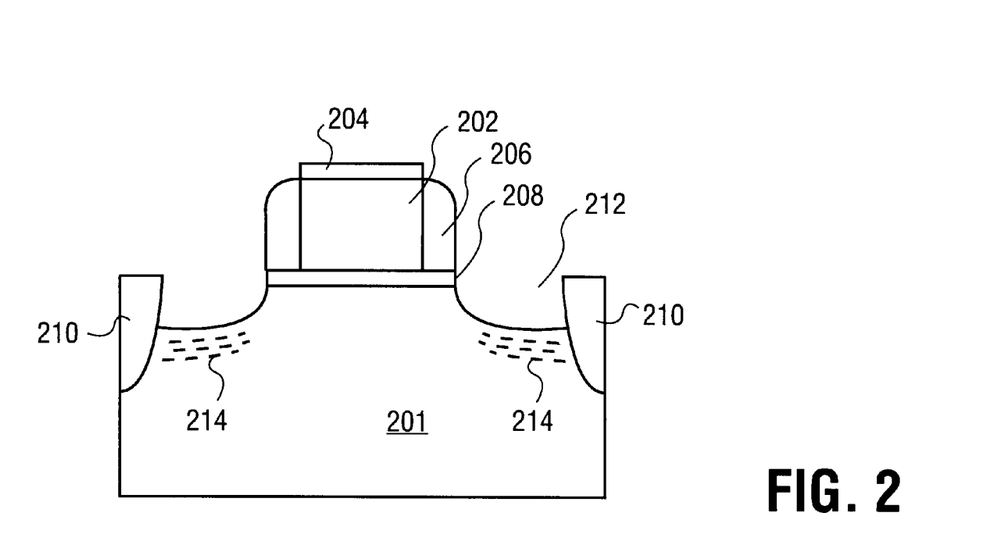
FIG. 2 is a schematic cross-section showing the structure of a partially completed MOSFET with recesses formed adjacent to the sidewall spacers and nitrogen implanted into the bottom portion of the recesses.
Figure 3:
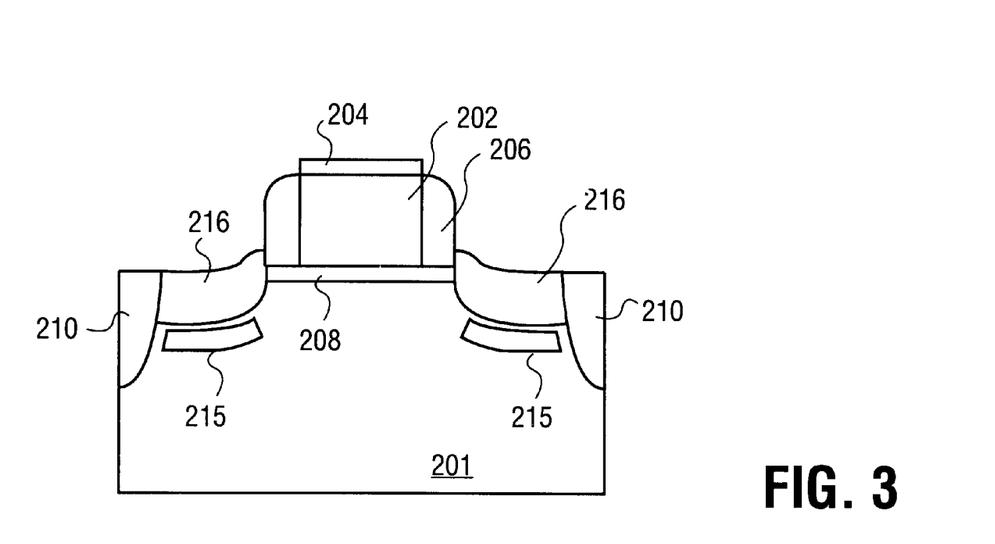
FIG. 3 is a schematic cross-section showing the structure of FIG. 2, after a selective silicon epi formation operation fills the recesses and the implanted nitrogen has been annealed.

Referring to FIGS. 2–3, a first illustrative embodiment of the present invention is described. As shown in FIG. 2, a wafer is processed in known ways to form one or more regions of semiconductor material 201 isolated by shallow trench isolation (STI) structures 210, wherein gate dielectric layer 208 is formed on the surface of semiconductor material 201, gate electrodes 202 are formed superjacent gate dielectric layer 208, and sidewall spacers 206 are typically formed adjacent to the sidewall of gate electrode 202. In embodiments of the present invention, sidewall spacers 206 are typically multi-layer spacers. Multilayer spacers may have an oxide layer formed from tetraethylorthosilicate (TEOS) and an overlying nitride layer formed from bis-(tertiary butylamino) silane (BTBAS). As further shown in FIGS. 2 and 3, a barrier layer 204 is formed over the top surface of gate electrode 202. Barrier layer 204 may be an anti-reflective coating sometimes referred to as BARC (bottom anti-reflective coating). Barrier layer 204 may be a silicon nitride layer, however any suitable material may be used that substantially prevents the polysilicon of gate electrode 202 from being etched during a process operation in which recesses 212 are formed in semiconductor material 201. For example, barrier layer 204 may be, but is not required to be, an oxide layer with an overlying oxynitride layer. Barrier layer 204 may also be referred to as a poly hardmask.

Subsequent to the formation of the gate electrode and STI structures described above, the surface of semiconductor material 201 is etched, selfaligned to the gate electrode and sidewall spacers so as to form trenches, or recesses 212. In the illustrative embodiment, substrate 201 is a silicon wafer, gate dielectric layer 208 is a silicon dioxide layer, and gate electrode 202 is formed from polysilicon. Although gate dielectric layer 208 is typically a thin layer of oxidized silicon, the thickness and chemical make-up of this gate insulator layer may be varied within the scope of the invention.

Recesses 212 are formed in the wafer at locations where the source/drain terminals of the FET will be located. The recesses are formed by the anisotropic etch of the wafer. The etch chemistry and conditions are preferably chosen such that the etch is highly selective and preferentially etches the wafer rather than the side wall spacers or the gate dielectric layer. In the illustrative embodiment, the wafer is silicon, the gate dielectric is an oxide of silicon, the gate electrode is polysilicon and the side wall spacers are silicon nitride. The plasma etch conditions are a pressure of 400 to 550 mT, a power of 250 to 350 Watts, a plate spacing of 0.5 to 1 cm, a He flow rate of 50 to 150 sccm, and $Cl_2$ flow rate of 100 to 200 sccm.

After the recesses are formed a cleaning operation is performed on the recess surfaces. A recess surface clean in accordance with the present invention may include a plasma etch in a parallel plate type plasma etcher such as those available from LAM Research Corp. Plasma conditions for the recess surface clean may include a pressure in the range of 200 to 300 mT, power in the range of 25 to 100 W, a plate spacing in the range of 0.8 to 1.5 cm, a He flow rate in the range of 200 to 350 sccm, and an SF6 flow rate in the range of 25 to 100 sccm. In one embodiment, the pressure is approximately 250 mT, the power is approximately 50 W, the plate spacing is approximately 1.1 cm, the He flow rate is approximately 150 sccm, and the $SF_6$ flow rate is approximately 50 sccm.

Those skilled in the art and having the benefit of this disclosure will recognize that the operations and structures shown and described herein, are compatible with various field oxide isolation architectures. Examples of field oxide isolation architectures include shallow trench isolation regions in a surface of a substrate, and the older local oxidation of silicon (LOCOS), which typically formed non-planarized oxide isolation regions.

Still referring to FIG. 2, an $N_2$ implant operation is performed into recesses 212, self-aligned to the gate electrode and the sidewall spacers. The $N_2$ implant operation is typically carried out with a dose ranging from $5 \times 10^{15}$ to $1 \times 10^{17}$ atoms/cm$^2$, and an energy ranging from 10 KeV to 20 KeV as shown by 214 in FIG. 2. That is, gate electrode 204 and sidewall spacers 206 act as barriers to the ion implantation operation. Subsequent to the implant operation, the wafer is cleaned with an ex situ HF dip. Alternatively, this cleaning operation may be achieved by an $SF_6$, dry etch.

Alternatively, carbon may be implanted rather than nitrogen. In such an alternative process, a silicon carbide layer is formed as a dielectric to isolate a portion of the source/drain terminal.

Referring to FIG. 3, recesses 212 are back-filled using a selective Si deposition process. That is, the recesses are filled with silicon 216 that is substantially single crystal, and takes its crystal orientation from that of the semiconductor material 201 which is found at the surface of recesses 212. In one embodiment of the present invention, the selective Si deposition takes place in a reaction chamber, such as an ASM Epsilon 2000 single wafer CVD reactor, at a temperature between 700° C. and 900° C., with an $H_2$ carrier gas with a flow rate between 10 and 40 slm, a dichlorosilane ($SiH_2Cl_2$) flow rate between 25 and 200 sccm, an HCl flow rate between 10 and 200 sccm, a pressure between 5 Torr and 200 Torr, and a susceptor rotation of approximately 35 rpm. In one embodiment, the deposition temperature is approximately 800° C., the $H_2$ carrier gas with a flow rate is approximately 20 slm, the $SiH_2Cl_2$ flow rate is approximately 120 sccm, the HCl flow rate is approximately 45 sccm, the pressure is approximately 20 Torr, and a deposition rate is achieved wherein a 1000 angstrom film can be deposited in approximately 6 minutes.

Subsequent to the selective Si deposition process, layer 204 is removed, typically by a wet etch. Subsequently, a high temperature anneal is performed, resulting in, among other things, the formation of a silicon nitride layer 215 below the source/drain terminals. Of course, if carbon rather than nitrogen was implanted, region 215 would be a silicon carbide layer. Various other known operations may then be performed in order to form the various levels of interconnection and insulation typically found on integrated circuits.

Figure 4:
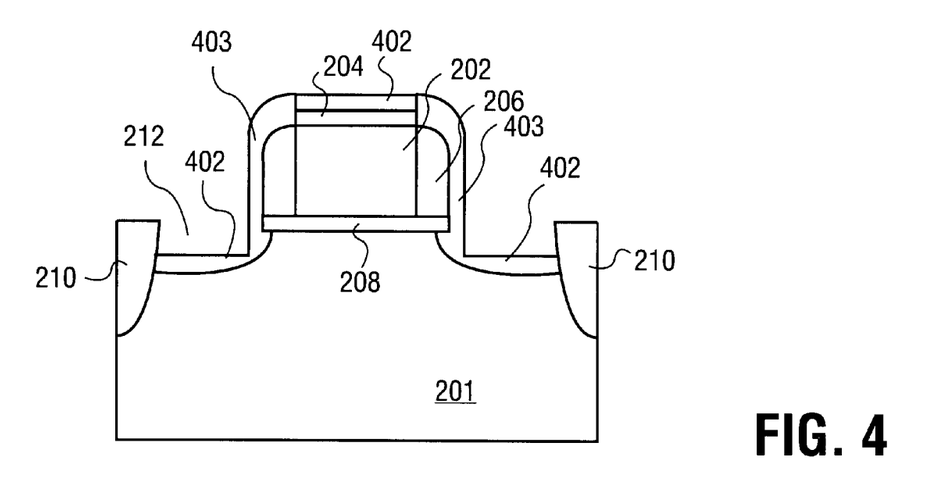
FIG. 4 is a schematic cross-section showing the structure of a partially completed MOSFET with recesses formed adjacent to the sidewall spacers and silicon nitride formed over the bottom and side surfaces of the recesses.

An alternative embodiment of the present invention is described in conjunction with FIGS. 4–7. This embodiment differs from that described in connection with FIGS. 2–3, in that rather than implanting and annealing nitrogen to form a silicon nitride layer, a deposition operation is performed to provide a silicon nitride layer to partially isolate source/drain terminals from the substrate in which they are formed. More particularly, FIG. 4 shows a wafer which has been processed in known ways to form one or more regions of semiconductor material 201 isolated by shallow trench isolation structures 210, wherein gate dielectric layer 208 is formed on the surface of semiconductor material 201, gate electrodes 202 are formed superjacent gate dielectric layer 208, and sidewall spacers 206 are typically formed adjacent to the vertical sidewalls of gate electrode 202. As further shown in FIG. 4, a barrier layer 204 is formed over the top surface of gate electrode 202. Barrier layer 204 may be an anti-reflective coating such silicon nitride, however any suitable material may be used that substantially prevents the polysilicon of gate electrode 202 from being etched during a process operation in which recesses 212 are formed in semiconductor material 201. Subsequent to the formation of the gate electrode and STI structures described above, the surface of semiconductor material 201 is etched, self-aligned to the gate electrode and sidewall spacers so as to form trenches 212. In the illustrative embodiment, substrate 201 is a silicon wafer, gate dielectric layer 208 is a silicon dioxide layer, and gate electrode 202 is formed from polysilicon.

Still referring to FIG. 4, approximately 30–50 nm of silicon nitride is directionally deposited over the surface of the wafer, including the surface of recess 212, the top and side surfaces of sidewall spacers 206, and the top surface of barrier layer 204 using plasma enhanced chemical vapor deposition (PECVD). This deposition operation results in a silicon nitride layer 402 along the bottom portion of recess 212 and a silicon nitride layer 403 along the side portion of recess 212 and the side surface of sidewall spacers 206, as shown in FIG. 4. Silicon nitride layer 402 is thicker and denser than silicon nitride layer 403. In an exemplary process in accordance with the present invention, a morphologically non-conformal nitride layer is deposited in a parallel plate direct plasma reactor, such as, for example, an Applied Materials Precision 5000. A wafer is placed on a grounded ceramic susceptor (i.e., the lower plate) and RF power (13.54 MHz) is delivered to an upper gas distribution plate. The plate spacing is in the range of 6 to 15 mm, the pressure is in the range of 500 to 1500 mTorr, the temperature is in the range of 250° C. to 350° C., the RF power is in the range of 0.02 to 0.5 W/cm$^2$, the $SiH_4$ flow rate is in the range of 0.01 to 0.05 sccm, the $NH_3$ flow rate is in the range of 0.1 to 0.3 sccm, and the $N_2$ flow rate is in the range of 2 to 6 sccm. In one embodiment, the plate spacing is approximately 12 mm, the pressure is approximately 700 mTorr, the temperature is approximately 275° C., the RF power is approximately 0.16 W/cm2, the $SiH_4$ flow rate is approximately 0.02 sccm, the $NH_3$ flow rate is approximately 0.2 sccm, and the $N_2$ flow rate is approximately 3 sccm. A nominal nitride layer thickness of 500 angstroms is used in one embodiment of the present invention.

Figure 5:
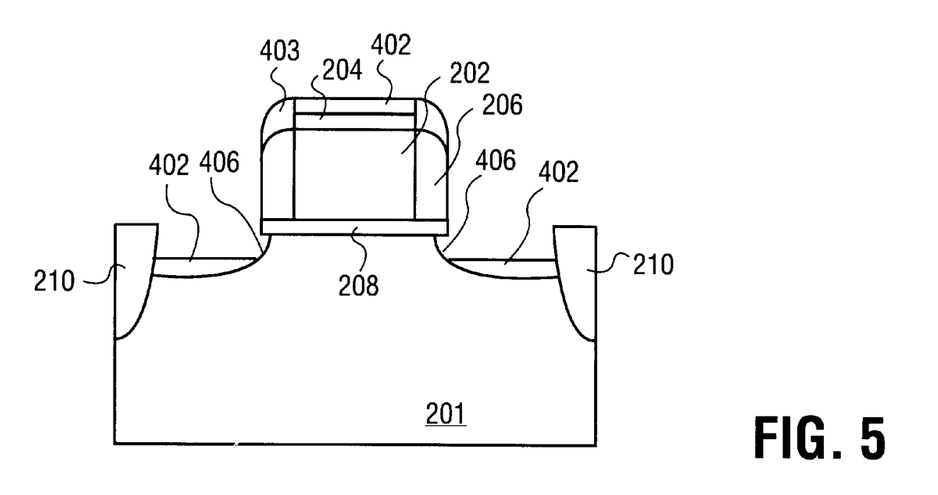
FIG. 5 is a schematic cross-section showing the structure of FIG. 4, after an etching operation removes silicon nitride from side surface of the recesses.

Referring to FIG. 5, it can be seen silicon nitride 403 has been removed from the side portion 406 of recesses 212 and the side of sidewall spacer 206, while silicon nitride 402 remains along the bottom surface of recess 212. Silicon nitride 403 is typically removed by etching in trimix for approximately 2 minutes. This permits the removal of nitride 403 while still leaving between approximately 20 nm to 30 nm of nitride 402 on the bottom portion of recess 212. Following the dip in trimix, the wafer is cleaned with a short $SF_6$ dry etch so as to prepare the side portion of recess 212 for selective silicon deposition. The side portion of recesses 212 act as a nucleation site for a subsequent operation in which recesses 212 is back-filled.

Figure 6:
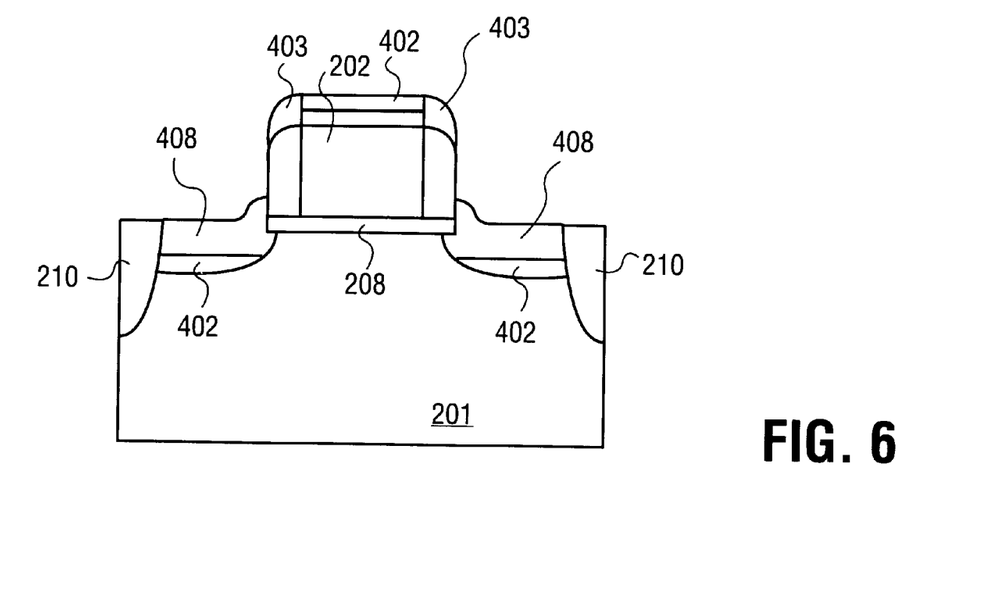
FIG. 6 is a schematic cross-section showing the structure of FIG. 3, after back-filling of the recesses.

Referring to FIG. 6, recesses 212 are back-filled with a selective silicon deposition layer 408 that is grown laterally outward from the side portion of recess 212. This lateral formation produces source/drain regions 408 that are partially isolated from the substrate by silicon nitride layer 402. Typically, source/drain regions 408 are formed of undoped silicon. Those skilled in the art and having the benefit of this disclosure will appreciate that alternative embodiments of the present invention may include the formation of source/drain regions 408 that may be either p-type or n-type depending on the gas mixtures used during the selective silicon deposition.

Figure 7:
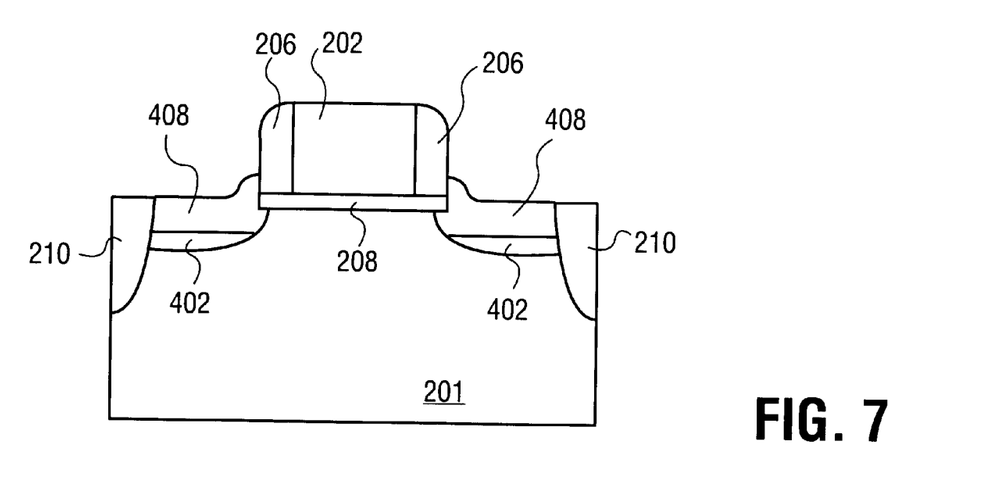
FIG. 7 is a schematic cross-section showing the structure of FIG. 6, after excess silicon nitride is removed from the MOSFET structure.

FIG. 7 shows the structure of FIG. 6, after the remaining portions of silicon nitride 403 overlying the top surface of sidewall spacers 206, and silicon nitride 402 overlying the top surface of barrier layer 204 have been removed by etching. As is further shown in FIG. 7, barrier layer 204 is also removed from the top surface of gate electrode 202. At this point the structure of FIG. 7, may be subjected to conventional processing steps such as, for example, the formation suicides on the exposed surfaces of the source/drains and gate electrode.

Those skilled in the art and having the benefit of this disclosure will recognize that the operations and structures disclosed above are applicable to the formation of both n-channel FETs (NFETs) and p-channel FETs (PFETs). NFETs and PFETs are structurally similar, however the relative placement of p-type and n-type dopants is different. That is, a PFET includes p-type source/drain terminals in an n-type body, and an NFET includes n-type source/drain terminals in a p-type body.

Conclusion

Embodiments of the present invention provide microelectronic structures such as, for example, FETs with source/drain terminals partially isolated from the well (or bulk semiconductor) in which they are formed. Further embodiments of the present invention provide methods of manufacturing such structures.

FETs embodying the present invention include back-filled source/drain terminals. In one embodiment, the doping concentration of the source/drain terminals can be controlled by controlling the gas mixture, temperature, and pressure, in a reaction chamber. Formation of the source/drain terminals in this way also provides increased margin for the thermal budget of the manufacturing process, since a high temperature operation is not required to activate the dopants, or to thermally in-diffuse the dopants into the tip portion of the source/drain terminals.

An advantage of particular embodiments of the present invention is that parasitic junction capacitance is reduced.

An further advantage of particular embodiments of the present invention is that charge leakage pathways between a source/drain terminal and the substrate are reduced.

A still further advantage of particular embodiments of the present invention is that source/drain terminals are provided with a measure of shielding from carriers generated by events such as alpha particle strikes.

It will be understood by those skilled in the art having the benefit of this disclosure that many design choices are possible within the scope of the present invention. For example, structural parameters, including but not limited to, gate insulator thickness, gate insulator materials, gate electrode thickness, sidewall spacer material, inter-layer dielectric material, isolation trench depth, and S/D and well doping concentrations may all be varied from that shown or described in connection with the illustrative embodiments. The dielectric layer formed at the bottom portion of the recesses may be silicon carbide rather than silicon nitride. Also, the operation of forming recesses and back filling with material may be repeated to tailor the shape and doping profile of the source/drain terminals.

It will be understood that various other changes in the details, materials, and arrangements of the parts and steps which have been described and illustrated may be made by those skilled in the art having the benefit of this disclosure without departing from the principles and scope of the invention as expressed in the subjoined Claims.

What is claimed is:

1. A method of forming a source/drain terminal, comprising:

forming a gate electrode having multi-layer sidewall spacers and a barrier layer superacent the gate electrode, wherein the barrier layer comprises silicon oxynitride;

forming a recess in the semiconductor surface, adjacent to the masked portion, the recess having a bottom portion and a side portion;

implanting ions into the bottom portion; and selectively forming a silicon layer disposed at least partially within the recess.

2. The method of claim 1, wherein the gate electrode comprises polysilicon and the barrier layer further comprises silicon dioxide.

3. The method of claim 1, wherein forming a recess comprises plasma etching for approximately 15 seconds, in a parallel plate plasma reactor having a plate spacing of approximately 0.8 cm, a pressure of approximately 475 mT, an RF power of approximately 300 W, a Cl flow rate of 150 sccm, and a He flow rate of approximately 100 sccm.

4. The method of claim 3, wherein implanting ions comprises implanting nitrogen.

5. A method of forming a source/drain terminal, comprising:

masking a portion of a semiconductor surface;

forming a recess in the semiconductor surface, adjacent to the masked portion, the recess having a bottom portion and a side portion;

implanting ions of carbon into the bottom portion; and selectively forming a silicon layer disposed at least partially within the recess.

6. A method of forming a source/drain terminal, comprising:

masking a portion of the semiconductor surface;

forming a recess in the semiconductor surface adjacent to the masked portion, the recess having a bottom portion and a side portion;

forming a layer of silicon nitride over the bottom portion of the recess such that the side portion of the recess is substantially exposed: and selectively forming a layer comprising silicon, beginning at the side portion of the recess and extending laterally away from the side portion.

7. The method of claim 6, wherein masking a portion of the semiconductor surface comprises forming a gate electrode having sidewall spacers and a barrier layer superjacent the gate electrode.

8. The method of claim 7, wherein the gate electrode comprises polysilicon; the sidewall spacers comprise an oxide layer and a nitride layer; and the barrier layer comprises silicon oxynitride.

9. The method of claim 6, wherein forming a recess comprises plasma etching for approximately 15 seconds, in a parallel plate plasma reactor having a plate spacing of approximately 0.8 cm, a pressure of approximately 475 mT, an RF power of approximately 300 W, a Cl flow rate of 150 sccm, and a He flow rate of approximately 100 sccm.

10. The method of claim 6, wherein forming the silicon nitride layer over the bottom portion of the recess comprises forming a morphologically nonconformal silicon nitride layer, the silicon nitride layer covering the bottom portion of the recess and the side portion of the recess, and wherein a portion of the silicon nitride layer covering the bottom portion of the recess is thicker and denser than a portion of the silicon carbide layer covering the side portion of the recess.

11. The method of claim 9, further comprising removing the portion of the silicon nitride layer covering the side portion of the recess.

12. The method of claim 10, wherein removing comprises etching in trimix.

13. The method of claim 6, further comprising, prior to selectively forming a layer comprising silicon, cleaning the recess in an $SF_6$ plasma.

14. A method of forming a source/drain terminal, comprising:

masking a portion of the semiconductor surface;

forming a recess in the semiconductor surface adjacent to the masked portion, the recess having a bottom portion and a side portion;

forming a layer of silicon nitride over the bottom portion of the recess such that the side portion of the recess is substantially exposed: and selectively forming a layer comprising silicon, beginning at the side portion of the recess and extending laterally away from the side portion.

15. The method of claim 14, wherein masking a portion of the semiconductor surface comprises forming a gate electrode having sidewall spacers and a barrier layer superadjacent the gate electrode.

16. The method of claim 15, wherein the gate electrode comprises polysilicon; the sidewall spacers comprise an oxide layer and a nitride layer; and the barrier layer comprises silicon oxynitride.

17. The method of claim 14, wherein forming a recess comprises plasma etching for approximately 15 seconds, in a parallel plate plasma reactor having a plate spacing of approximately 0.8 cm, a pressure of approximately 475 mT, an RF power of approximately 300 W, a Cl flow rate of 150 sccm, and a He flow rate approximately 100 sccm.

18. The method of claim 14, wherein forming the silicon carbide layer over the bottom portion of the recess comprises forming a morphologically nonconformal silicpn carbide layer, the silicon carbide layer covering the bottom portion of the recess and the side portion of the recess, and wherein a portion of the silicon carbide layer covering the bottom portion of the recess is thicker and denser than a portion of the silicon carbide layer covering the side portion of the recess.

19. The method of claim 17, further comprising removing the portion of the silicon carbide layer covering the side portion of the recess.

20. The method of claim 18, wherein removing comprises etching in trimix.

21. The method of claim 14, further comprising, prior to selectively forming a layer comprising silicon, cleaning the recess in an $SF_6$ plasma.

* * * * *

UNITED STATES PATENT AND TRADEMARK OFFICE
CERTIFICATE OF CORRECTION

PATENT NO. : 6,541,343 B1  Page 1 of 1
DATED : April 1, 2003
INVENTOR(S) : Murthy et al.

It is certified that error appears in the above-identified patent and that said Letters Patent is hereby corrected as shown below:

<u>Column 7,</u>
Line 44, delete "suicides", insert -- silicides --.

Signed and Sealed this

Sixteenth Day of September, 2003

JAMES E. ROGAN
*Director of the United States Patent and Trademark Office*